US008233270B2

(12) United States Patent
Pierson et al.

(10) Patent No.: US 8,233,270 B2
(45) Date of Patent: Jul. 31, 2012

(54) MODULAR DATA CENTER (75) Inventors: Thomas L. Pierson, Sugar Land, TX (US); Loyd Guillot, Missouri City, TX (US); Michael Felker, Missouri City, TX (US)

(73) Assignee: Turbine Air Systems, Ltd., Houston, TX (US)

( * ) Notice: Subject to any disclaimer, the term of this patent is extended or adjusted under 35 U.S.C. 154(b) by 222 days.

(21) Appl. No.: 12/623,167

(22) Filed: Nov. 20, 2009

(65) Prior Publication Data

US 2011/0122561 A1  May 26, 2011

(51) Int. Cl.
*G06F 1/16* (2006.01)

(52) U.S. Cl. .................. 361/679.02; 345/163; 455/349; 62/199

(58) Field of Classification Search .................. 361/690, 361/695, 679.55, 679.56, 679.01, 679.02, 361/679.06, 679.22; 345/157, 158, 163; 455/575.5, 550.1, 90.1, 349; 62/89, 237, 62/259.2, 199
See application file for complete search history.

(56) References Cited

U.S. PATENT DOCUMENTS

| | | | |
|---|---|---|---|
| 3,777,506 A | 12/1973 | Hergatt et al. | |
| 5,467,609 A | 11/1995 | Feeney | |
| 5,544,012 A | 8/1996 | Koike | |
| 6,412,292 B2 | 7/2002 | Spinazzola et al. | |
| 6,494,050 B2 | 12/2002 | Spinazzola et al. | |
| 6,535,382 B2 | 3/2003 | Bishop et al. | |
| 6,786,056 B2 | 9/2004 | Bash et al. | |
| 6,859,366 B2 | 2/2005 | Fink | |
| 7,278,273 B1 | 10/2007 | Whitted et al. | |
| 7,327,563 B2 * | 2/2008 | Cauthron | 361/679.55 |

OTHER PUBLICATIONS

International Search Report and Written Opinion for PCT/US10/57151, mailed Jan. 27, 2011, 11 pages.

* cited by examiner

*Primary Examiner* — Hung Duong
(74) *Attorney, Agent, or Firm* — Haynes and Boone, LLP (57) ABSTRACT

A modular data center is constructed utilizing two building modules, wherein each of two modules includes a computer rack disposed therein which computer rack is spaced apart from an exterior wall to define an exterior access space and spaced apart from an interior opening to define an interior access space. When the two building modules are joined so that the openings abut one another, the interior access spaces of the two modules form a contiguous space between the two computer racks, which space satisfies access requirements for each computer rack. The interior access space between the two computer racks may be enclosed to form an environment that can be separately cooled from the remainder of the modular data center. A method provides two building modules, each containing a computer rack, which modules are joined so that the access spaces for the computer racks overlap, wherein a portion of the computer rack access space of one module forms part of the computer rack access space of the other module.

34 Claims, 10 Drawing Sheets

MODULAR DATA CENTER

BACKGROUND

The present invention generally relates to a computing data center and more particularly, to a modular data center with modular components for use with rack or shelf mounted computing systems. Methods of forming the modular data center are also provided.

Data centers have traditionally been built utilizing a design specification usually provided by an engineering firm. This specification is then provided to general contractors to provide a bid price for purchasing the components and building the data center at the owner's location. The design and construction of the data center may include the data center, which consists primarily of server racks, air conditioning systems to cool the racks, the building to house the various components, electrical feeder equipment, emergency generators and their associated fuel storage tanks, chilled water plants, and uninterruptible power supply (UPS) equipment.

Recently, attempts have been made to create modular data centers by installing the components into shipping containers, typically eight feet in width. This allowed the computer racks and other equipment to be factory installed and readily shipped, thereby reducing the amount of labor and construction necessary at the job site.

A drawback to the use of shipping containers is the limited amount of width available in a shipping container. Standard shipping containers are only eight feet wide. This fixed width limits the amount of access space to the various components installed within the shipping container. For example, it is generally desirable to have at least three feet of access space on either side of a server rack. When the server racks themselves are three feet wide, three feet of access space on either side of the server racks cannot be obtained.

There exists the need in which a modular data center can be provided that allows for the individual modules to be easily transportable, but provides in an assembled modular data center a layout configuration of components that provides the access space required for the various components.

SUMMARY

According to certain embodiments of the present invention, a modular data center is provided that is constructed utilizing adjoining building modules wherein the access space of the adjoining building modules is combined to permit at least two computer racks to be housed therein while satisfying the access space requirements for both sets of racks. Specifically, according to such embodiments, two or more building modules are provided, each having a base, that may be fabricated out of structural steel or other suitable materials, that is utilized as the foundation of the building module. One elongated, exterior side of each module is provided with a wall while the opposing side has an opening formed therein. Each module is disposed for receipt of a server rack spaced apart from the elongated exterior module wall a predetermined distance so as to satisfy the access requirements for the exterior side of the server rack. In one embodiment, the computer rack is parallel with the exterior wall. In one embodiment, the computer rack is perpendicular to the exterior wall. The bases of the two or more modules are bolted or otherwise attached to one another, so that the open sides abut, to form a prefabricated building where the interior portions of the access space of the two or more modules are combined across the split via the abutting open sides. The two or more modules form a much larger contiguous data center which would be more akin to a traditional field erected data center compared to utilizing multiple individual shipping containers. According to such embodiments of the present invention, the use of shared access space between two or more coupled modules allows sufficient access space for personnel to access the aisle between two or more rows of computer racks. In the case of three or more modules, both of the elongated sides of the center module are provided with openings.

In one embodiment of the invention, a modular data center includes a first module having a first side with a wall disposed along the first side, a second side opposite the first side with an opening formed in the second side, a first access area adjacent the opening and a first computer rack disposed between the first side and the first access area; and a second module having a first side with a wall disposed along the first side, a second side opposite the first side with an opening formed in the second side, a second access area adjacent the opening and a second computer rack disposed between the first side and the second access area; wherein the first module is joined with the second module so that the first and second access areas are combined and extend between the first and second computer racks. The modular data center may include an enclosure around the first and second access areas whereby the combined access areas are enclosed. In one embodiment, the computer racks form part of the enclosure around the access areas. The modular data center may include a cooling system, wherein the cooling system is segregated to separately cool the enclosed access area from the rest of the modular data center. The modular data center may include where the first module and the second module are bolted together and where the first module and the second module each further comprise a structural base rail, a floor mounted on top of the structural base rail and a chase formed beneath the floor. The modular data center may include a platform on which each computer rack is mounted, each platform having a base with at least two apertures disposed therein. The modular data center may further include a plurality of platforms, each platform containing one or more computer rack and each platform adapted to be engaged by a forklift or similar device to ease in manipulation of a bank of computer racks during pre-fabrication of a module.

In another embodiment of the invention, a method of forming a modular data center includes providing a first structural module having a first computer rack mounted therein and a first access area defined adjacent the first computer rack; providing a second structural module having a second computer rack mounted therein and a second access area defined adjacent the second computer rack; and securing the first structural module and the second structural module to one another so that the first and second access areas are combined and extend between the first and second computer racks. The method may further include forming an enclosure around the first and second access areas to form an enclosed access area and separately cooling the enclosed access area from the rest of the modular data center. The first module and the second module are bolted together and further comprise forming a co-extensive chase beneath the floor of the secured first and second modules. The method may further include installing a plurality of computer racks in each module prior to securing the modules to one another, wherein the plurality of computer racks are mounted on a platform which platform is disposed to be moved and installed as one integral unit.

BRIEF DESCRIPTION OF THE DRAWINGS

A more complete understanding of the present disclosure and advantages thereof may be acquired by referring to the following description taken in conjunction with the accompanying figures, wherein.

DESCRIPTION OF THE PREFERRED EMBODIMENTS

To facilitate a better understanding of the present invention, the following examples of certain embodiments are given. In no way should the following examples be read to limit, or define, the scope of the invention.

Figure 1:
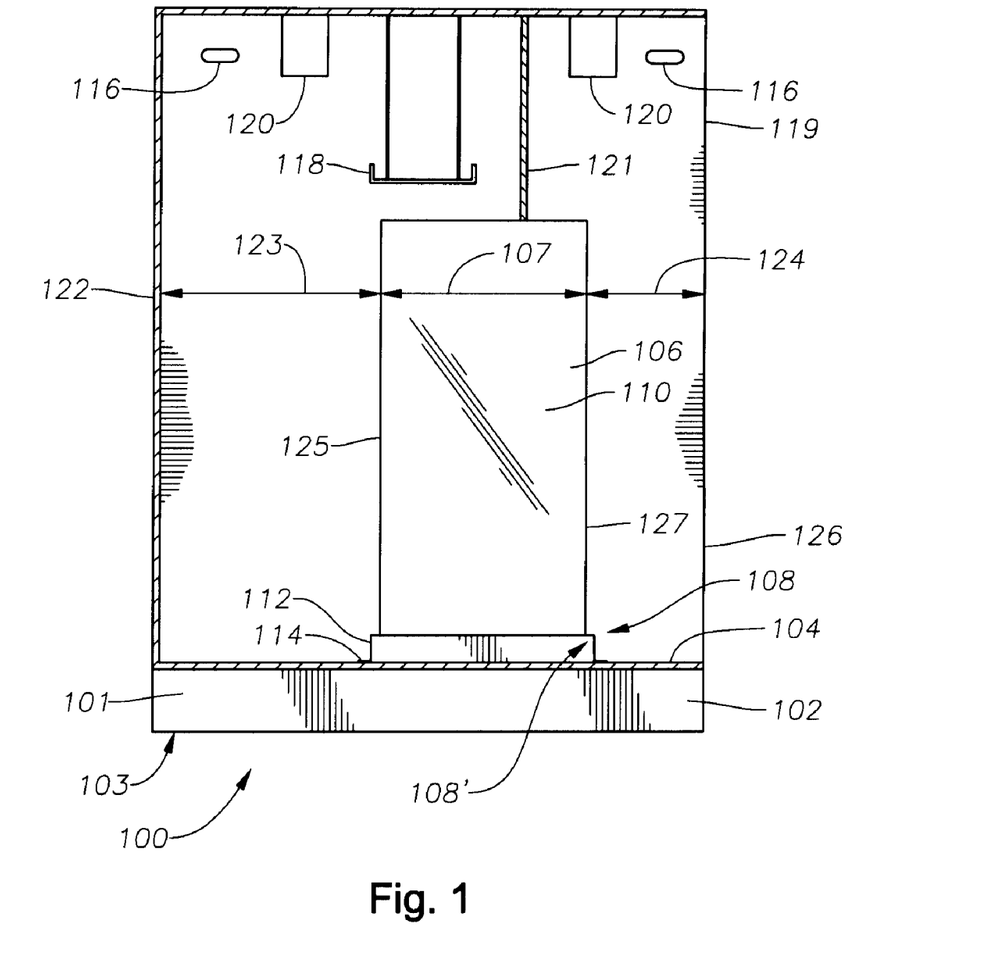
FIG. 1 illustrates an end view of a module.
Figure 2:
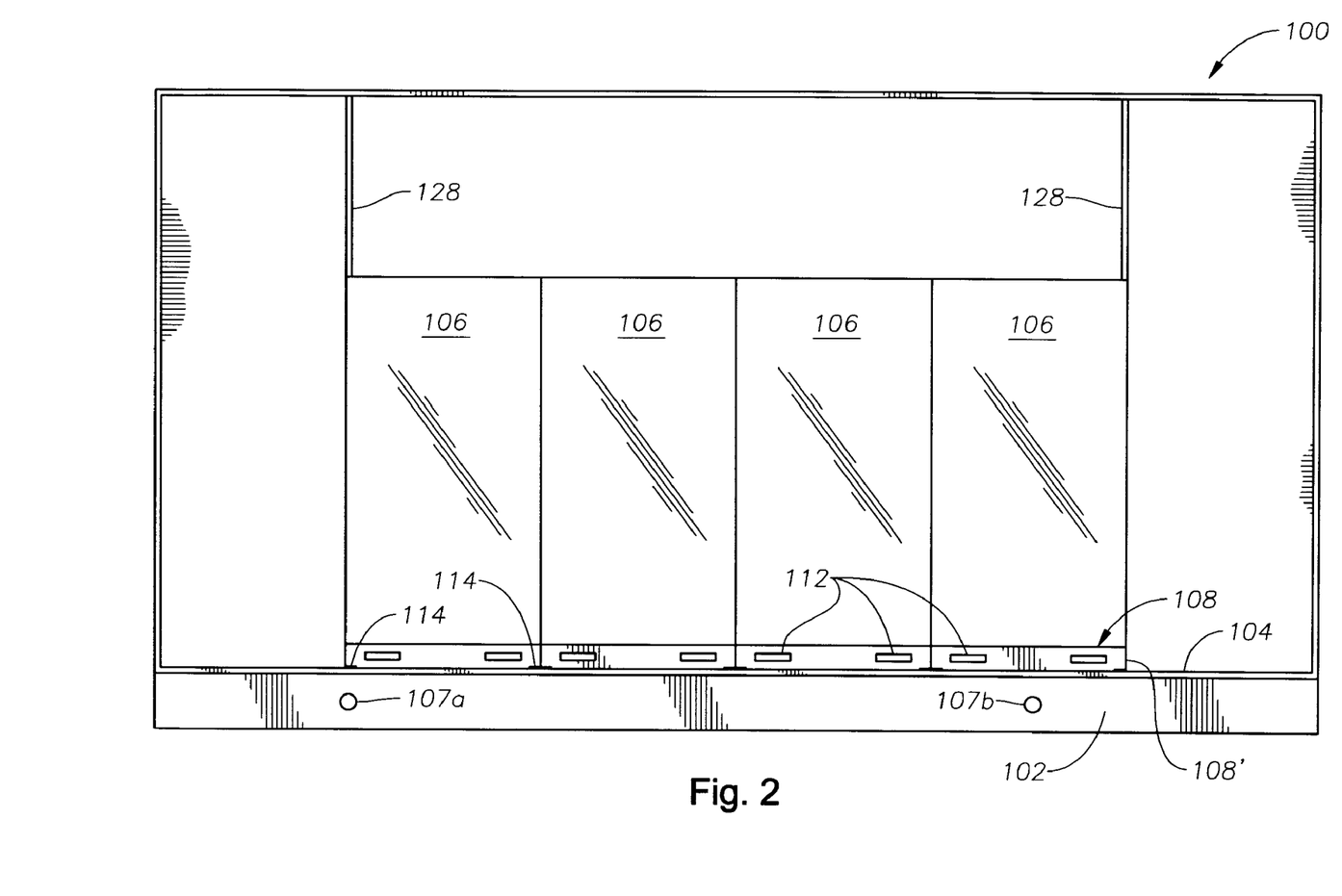
FIG. 2 illustrates a side view of a module.
Figure 3:
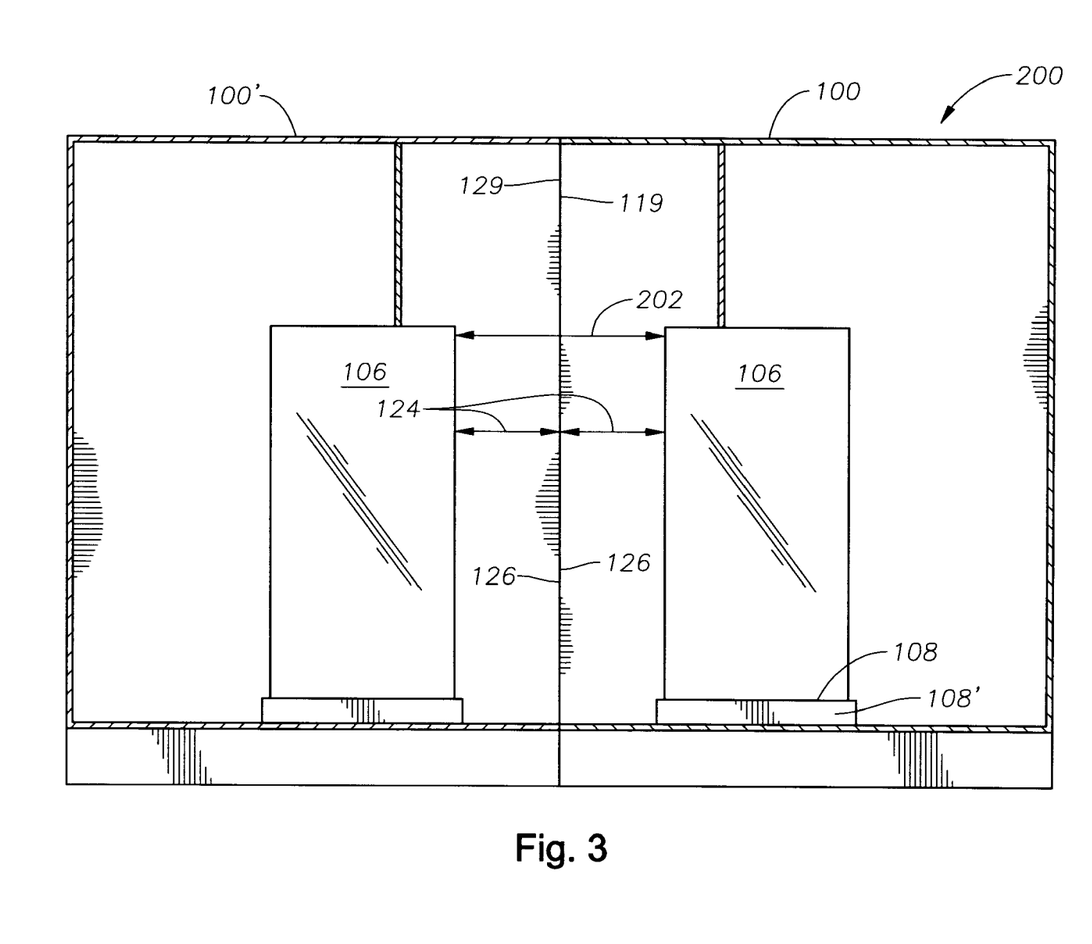
FIG. 3 illustrates an end view of a modular data center.

FIGS. 1 and 2 illustrate a cut-away end view and a cut-away side view, respectively, of a module 100 to be used in a modular data center 200 (shown in FIG. 3). According to certain embodiments, the width of the module 100 is selected to facilitate ease in shipping. For example, in one embodiment, the width is approximately 8 feet wide to be consistent with standard shipping containers. In another embodiment, the width is approximately 14 feet wide. In any event, module 100 includes a structural rail base 102 upon which is mounted the floor 104 and the bottom 103. Module 100 has an elongated, exterior wall 122 on one side and an opening 119 on the opposite side 126. The structural rail base 102 may be formed of structural steel, formed sheet metal, aluminum or other suitable material known to those of ordinary skill in the art. The bottom 103 and floor 104 may be formed of steel treadplate, aluminum or other suitable material as known to those of ordinary skill in the art. Computer rack unit 106 is mounted on floor 104 within the module 100. In the illustrated embodiment, computer rack unit 106 is mounted to be parallel to elongated exterior wall 122. Computer rack unit 106 may include a platform 108 upon which are mounted the computer racks 110. Computer rack 110 may include various electronic modules that may correspond to various components of a computer system or server. For example, computer rack 110 may include central processing units (CPUs), control modules, various memory modules such as hard drives, CD/DVD drives, random access memory, modules for processing, network interfaces, telecommunication modules, and/or Internet connectivity. In addition, other types of modules could be incorporated into the computer rack unit 106 such as, for example, power distribution unit (PDU), uninterruptible power supply (UPS), variable frequency drives (VFDs), electric motor starter cabinets, and/or programmable logic controllers. Computer rack unit 106 may include one or more doors (not shown) or access panels to allow personnel access to the internal components.

In addition to providing a foundation upon which a module 100 is pre-fabricated, structural rail base 102 may be used to form an access chase 101 or plenum beneath floor 104. The height of rail base 102 may be selected to accommodate the desired use of the chase 101, such as for example, wiring, plumbing or air conditioning. While the dimensions of base rail 102 are not a limitation, preferably, rail base 102 has a height ranging from 6" to 24." In one preferred embodiment, rail base 102 is provided with a pair of chilled water supply and return fittings 107a and 107b, respectively, on both ends of the rail base, thereby permitting multiple rail bases to be readily attached to one another in mirror fashion.

The platform 108 includes a base 108' which may have openings 112 to facilitate manipulation of the base 108 and computer racks 110. In one embodiment, the forks of a forklift (not shown) may be inserted into openings 112 in the platform base 108' to aid in the assembly of the module 100. Platform 108 may further include mounting brackets 114 to allow the computer rack unit 106 to be, for example, bolted to the floor 104. The module 100 may also include various lights 116, cabling racks 118, and safety equipment 120, such as, for example, sprinklers or other fire suppression equipment, smoke detectors, fire detectors, and/or ventilation equipment. In one embodiment, the cabling can be located beneath the floor 104.

In one embodiment, the module 100 includes a cooling partition 121 that is oriented from the top of the modular data center 100 to the top of the computer rack unit 106 and may run the full length of the computer rack unit 106. The cooling partition 121 may be made of glass, wood, metal, plastic, plexiglass or other suitable material known to those of ordinary skill in the art for forming a cooling partition.

While the width of the module 100 is not intended as a limitation, in one illustrative example and as shown in FIG. 1, module 100 is approximately 8 feet wide. In this embodiment, the computer rack unit 106 has a width 107 of approximately 3 feet and is positioned with approximately 3 feet of access space 123 between the exterior wall 122 of the module 100 and the exterior side 125 of the computer rack unit 106. This positioning results in approximately 2 feet of access space 124 between the interior side 127 of the computer rack unit 106 and the opening 119 on the module side 126 opposite exterior wall 122.

FIG. 3 illustrates a cut-away end view of two modules 100 and 100' wherein their sides 126, with their respective openings 119 therein, are aligned and the two modules are connected to form a modular data center 200. The two modules 100 and 100' may be connected by any suitable means known to those of ordinary skill in the art, such as bolting the two units together or welding them together. The modular data center 200, formed of the two modules 100 and 100', therefore combines the access space 124 of module 100 and module 100' so that there is approximately double the width in the combined space 202 between the computer rack units 106. Thus, whereas the access space 124 of any single module 100 may not satisfy the access space required around a computer rack unit 106, the combined space 202 satisfies the access space requirements for both computer rack units 106. In the illustrative example from the preceding paragraph, the combined access space would be approximately 4 feet wide. Thus, the combined access spaces 124 across the split 129 in modular data center 200 satisfies the access space requirements for either computer rack unit 106 individually, or both computer rack units 106 collectively.

Although not illustrated, the various heating, cooling, ventilation, safety, electrical and data systems of modular data centers may also be arranged to be connected together when modular data center 200 is formed.

Figure 4:
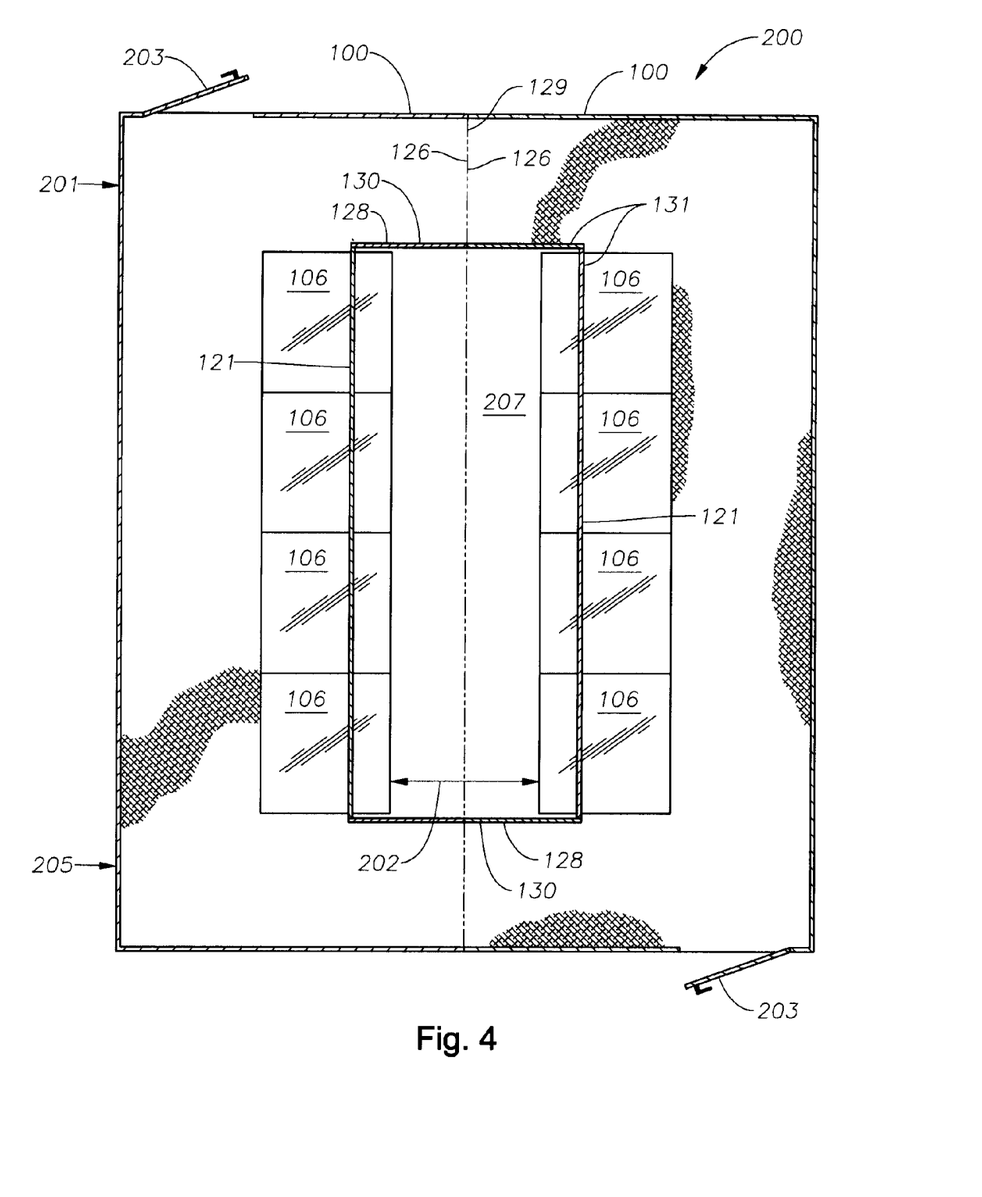
FIG. 4 illustrates a top view of a modular data center.

FIG. 4 illustrates a top view of one embodiment of modular data center 200. Modular data center 200 may have one or more doors 203 for entry or exit. In one embodiment, computer rack units 106 extend along a significant portion of the length of the modular data center 200 from a first end 201 to a second end 205. Each computer rack unit 106 has a cooling partition 121 that extends the full length of the computer rack unit 106 between its two ends. Cooling partition ends 128 extend between the adjacent computer rack units 106 and form an enclosure 131 around the access space 202 formed between the computer rack units 106. In one embodiment, one or both cooling partition ends may include a door 130 for access to space 202. In this embodiment, those of ordinary skill in the art will appreciate that the computer rack units 106 themselves may also form part of the enclosure 131 around space 202. In any event, the environment within the enclosure 131 around space 202 may be separately cooled or regulated from the remainder of the interior of modular data center 200. In this regard, the temperature within the enclosure 131 forms a cold air zone 207 or "cold" aisle within modular data center 200.

Figure 5:
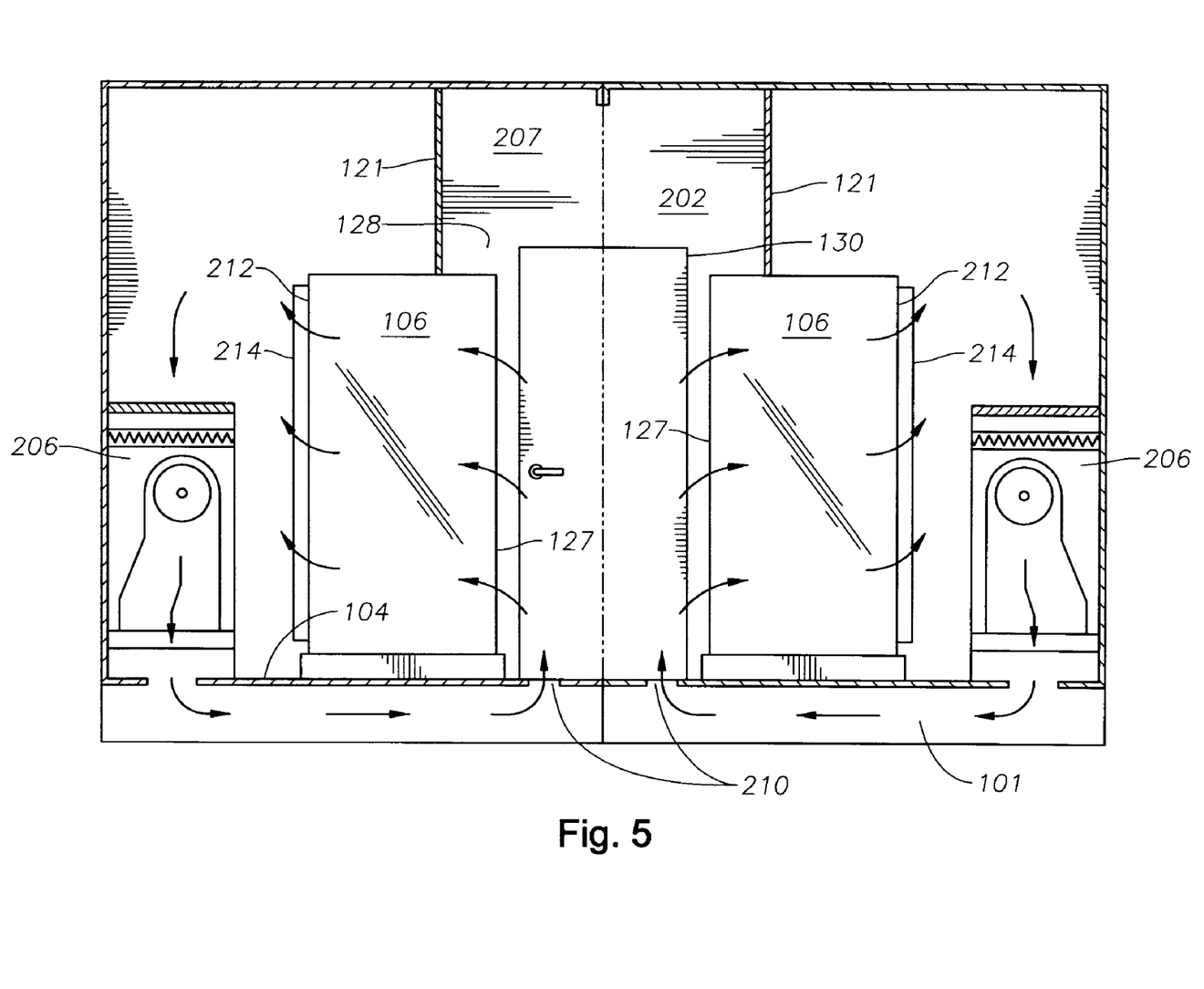
FIG. 5 illustrates an end view of a cooling system for a modular data center.
Figure 6:
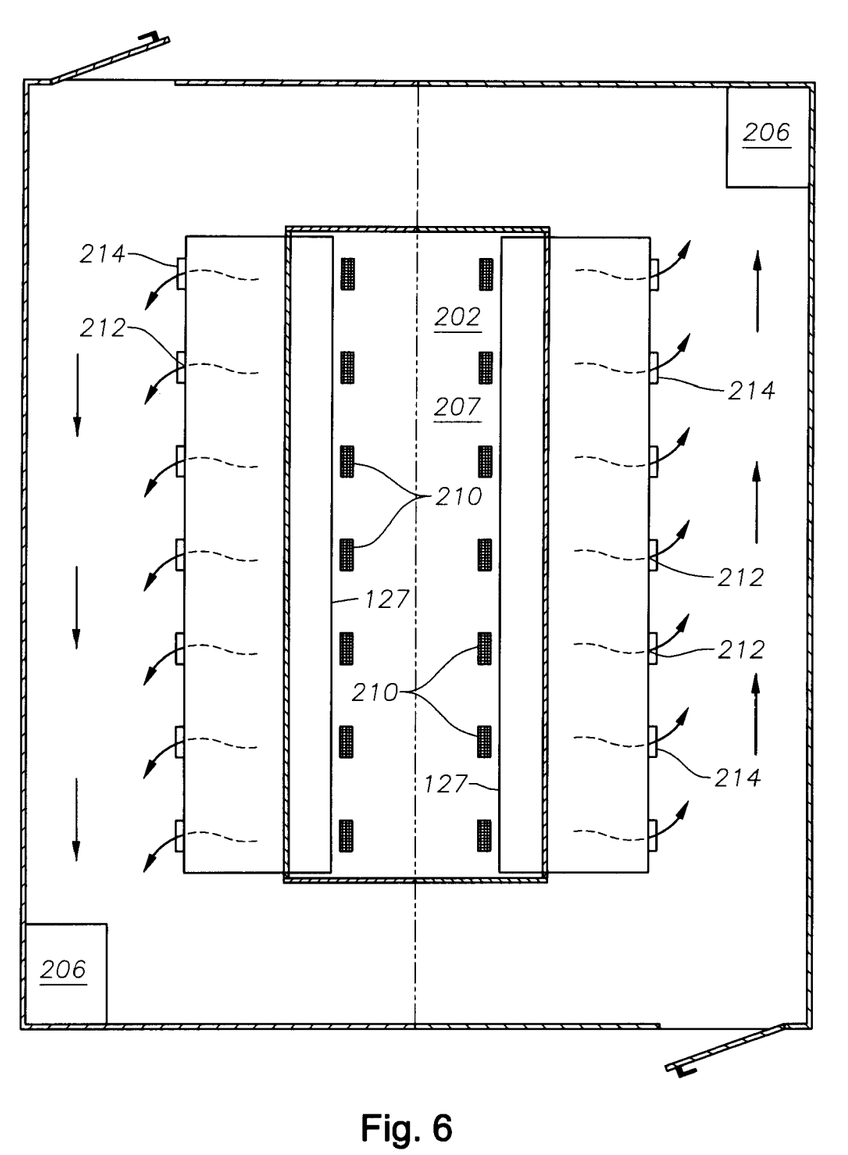
FIG. 6 illustrates a top view of a cooling system for a modular data center.

FIGS. 5 and 6 illustrate a cut-away end view and cut-away top view, respectively, of one embodiment of modular data center 200, in which air conditioning unit 206 supplies cool air through the floor 104 and pressurizes a chase 101 to function as an air plenum. Supply air inlets 210 in the floor 104 allow the cool air to enter the "cold aisle" access space 202 from the chase 101. In one embodiment, the floor 104 in the access space 202 may be perforated to allow the cool air to flow up through the floor 104. The enclosed access space 202 may then be a cold air zone 207 that supplies cooled air to the interior side 127 of the computer rack units 106. The cool air then passes through the computer rack units 106 as shown and passes through return air holes 212 located in the rear of the computer rack units and the warmed air returns to the air conditioning units 206. Air conditioning units 206 may be any suitable air conditioning unit known to those of ordinary skill in the art, for example, it may use chilled water, or a refrigerant supplied by an outside condensing unit, or, if the climate is sufficiently hot and dry, evaporative cooling. In one embodiment, air conditioning unit 206 is designed with an economizer to take advantage of cool outside air when it is available to save on air conditioning expenses. In an alternative embodiment the air conditioning unit 206 could also be located under the floor 104 within the chase 101 formed by the structural base rail 102 or the air conditioning unit could be formed as part of the computer rack unit 106. The walls 122, roof, floor 104, and bottom 103 of the modular data center 200 may be insulated to aid in the efficiency of the air conditioning system. Likewise, cold air may also be supplied in other ways to the "cold" aisle without departing from the spirit of the invention, such as through overhead ducts. In another embodiment, rear cooling coils 214 may be provided adjacent the return air holes 212 located in the rear of the computer rack units 106 so that the warm air exiting the computer rack units 106 is immediately cooled. Rear cooling coils 214 are connected to chilled water piping (not shown) located in the chase 101.

Figure 7:
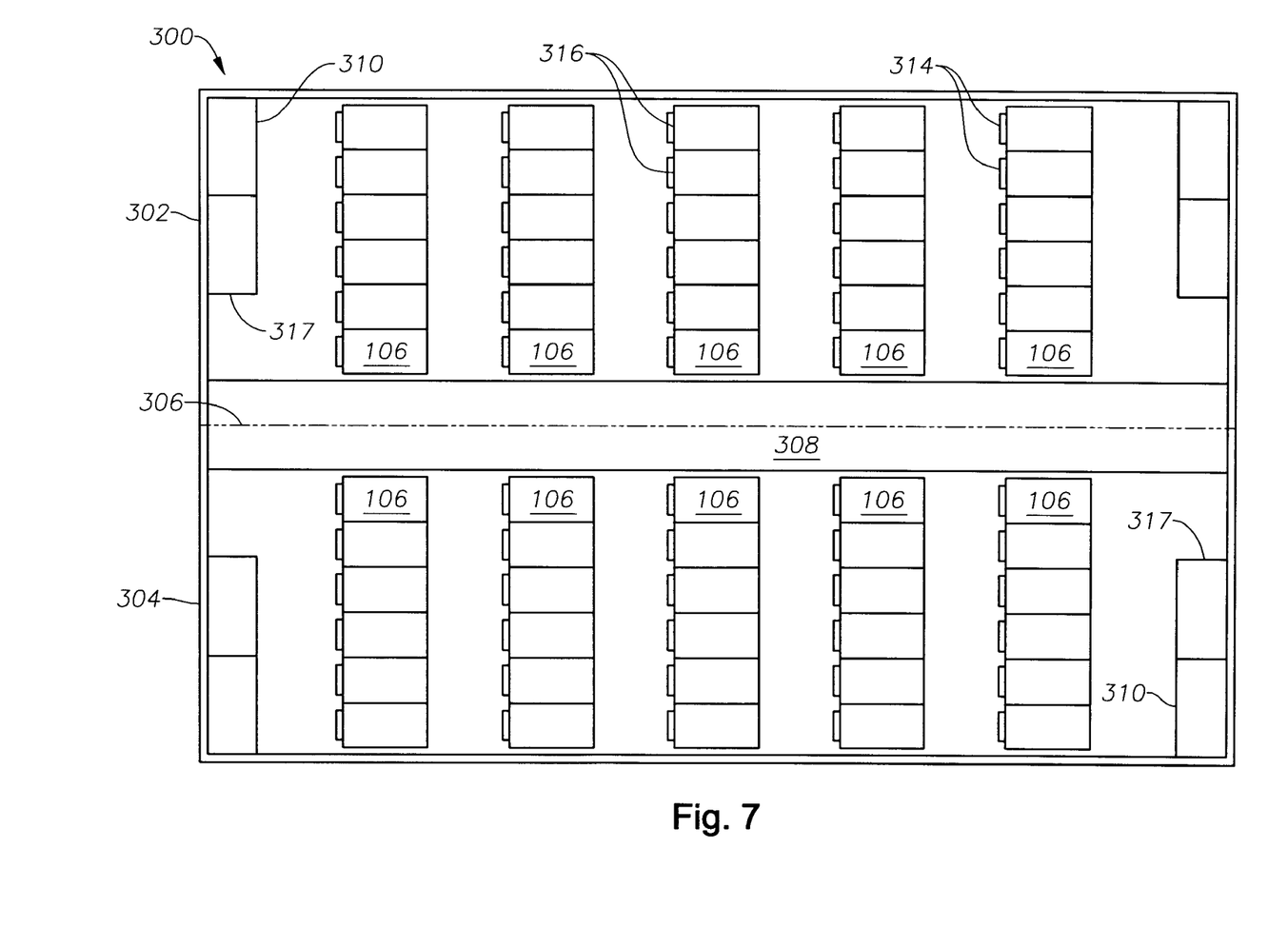
FIG. 7 illustrates a top view of a modular data center.
Figure 8:
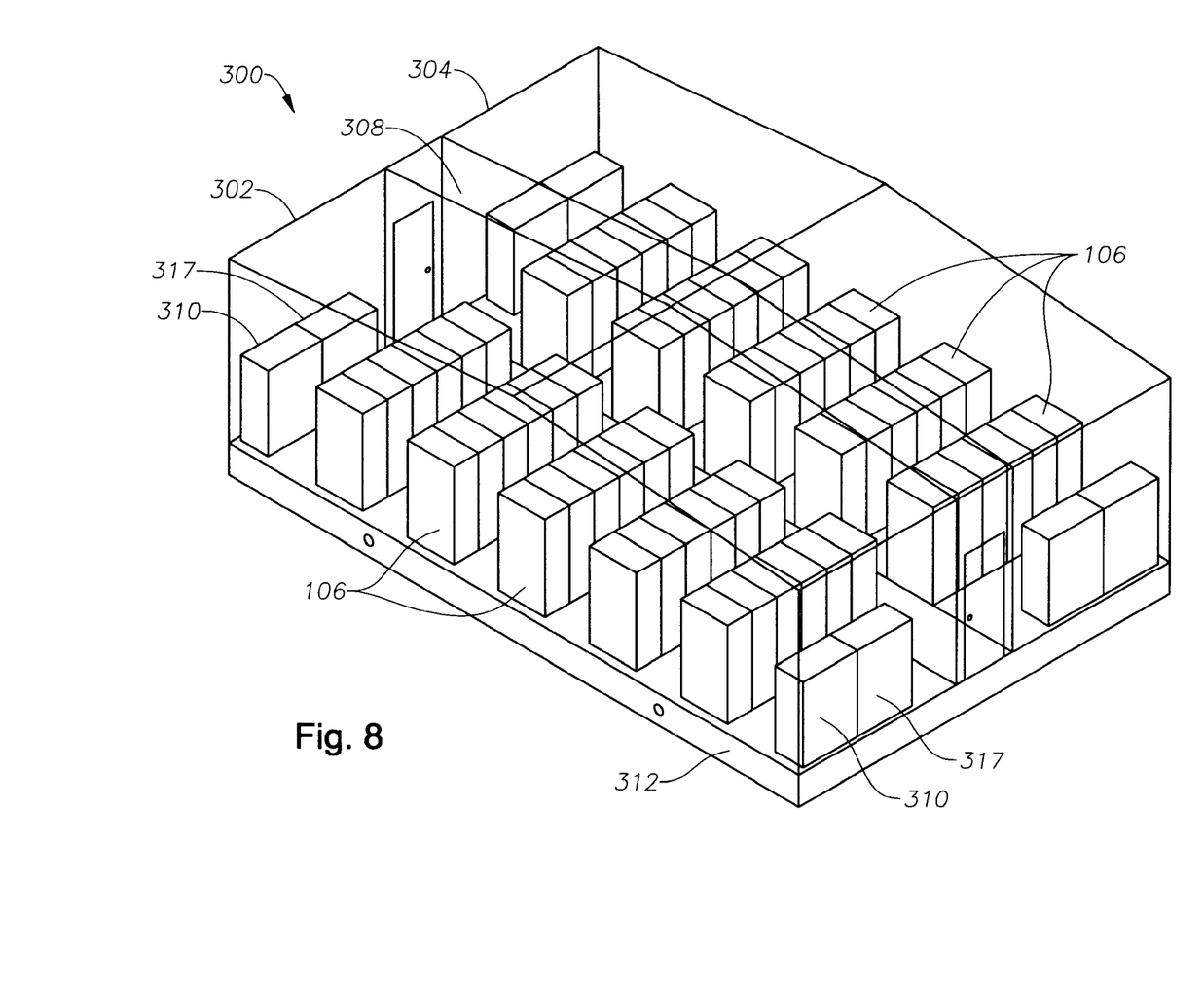
FIG. 8 illustrates an isometric view of a modular data center.

FIGS. 7 and 8 illustrate a cut-away top view and isometric view, respectively, of one embodiment of a modular data center 300 which was formed by the combination of modules 302, 304 across split 306 as generally described above. However, in this embodiment of the invention, each module 302 and 304 has a plurality of computer rack units 106 generally arranged perpendicular to the elongated exterior wall. In this case, the ends of the computer racks in the adjacent modules 302, 304 "share" the access space 308 across split 306. Modular data center 300 may be cooled by an air conditioning unit 310 supplying cooled air to an under-floor chase 312, similar to the air conditioning system described for modular data center 200 above. In this embodiment, an enclosure may be formed around access space 308 to form a cold aisle along the split 306 between and encompassing the ends of the computer rack units 106. Alternatively, partitions can be installed along the length of adjacent computer rack units 106, from exterior wall to exterior wall in order to form the cold aisle. Computer rack units 106 may include rear cooling coils 314 that are mounted to the return air openings 316 of the computer rack units 106. Rear cooling coils 314 may be connected to chilled water piping (not shown) located in the chase 312. A coolant distribution unit 317 may be located within the modular data center 300 to control the chilled water flow and temperature to the rear cooling coils 314.

Figure 9:
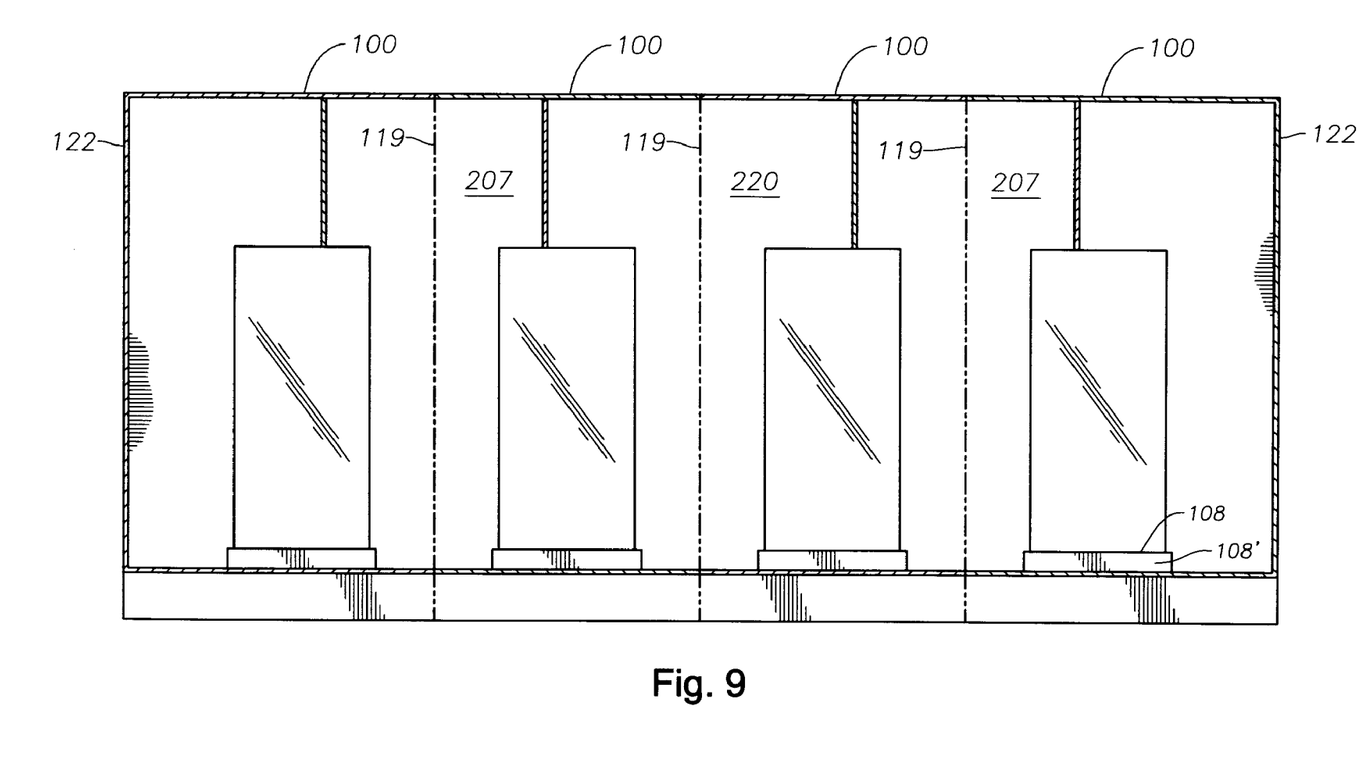
FIG. 9 illustrates an end view of a modular data center.

FIG. 9 illustrates another embodiment of the invention in which a plurality of building modules 100 may be secured to one another to create alternating "cold" and "warm" aisles. In such case, only the outside modules 100 will have an exterior wall 122, while those modules 100 aligned therebetween will have openings 119 on both of the elongated sides 126. In this arrangement, multiple rows of computer racks 106 are arranged in parallel relative to the outside walls. The shared access space across a building split will alternate between an enclosed, combined space that is cooled as described above, thereby forming a "cold" aisle 207 and an unenclosed shared access space 220 across a building split, i.e., a "warm" aisle.

Figure 10:
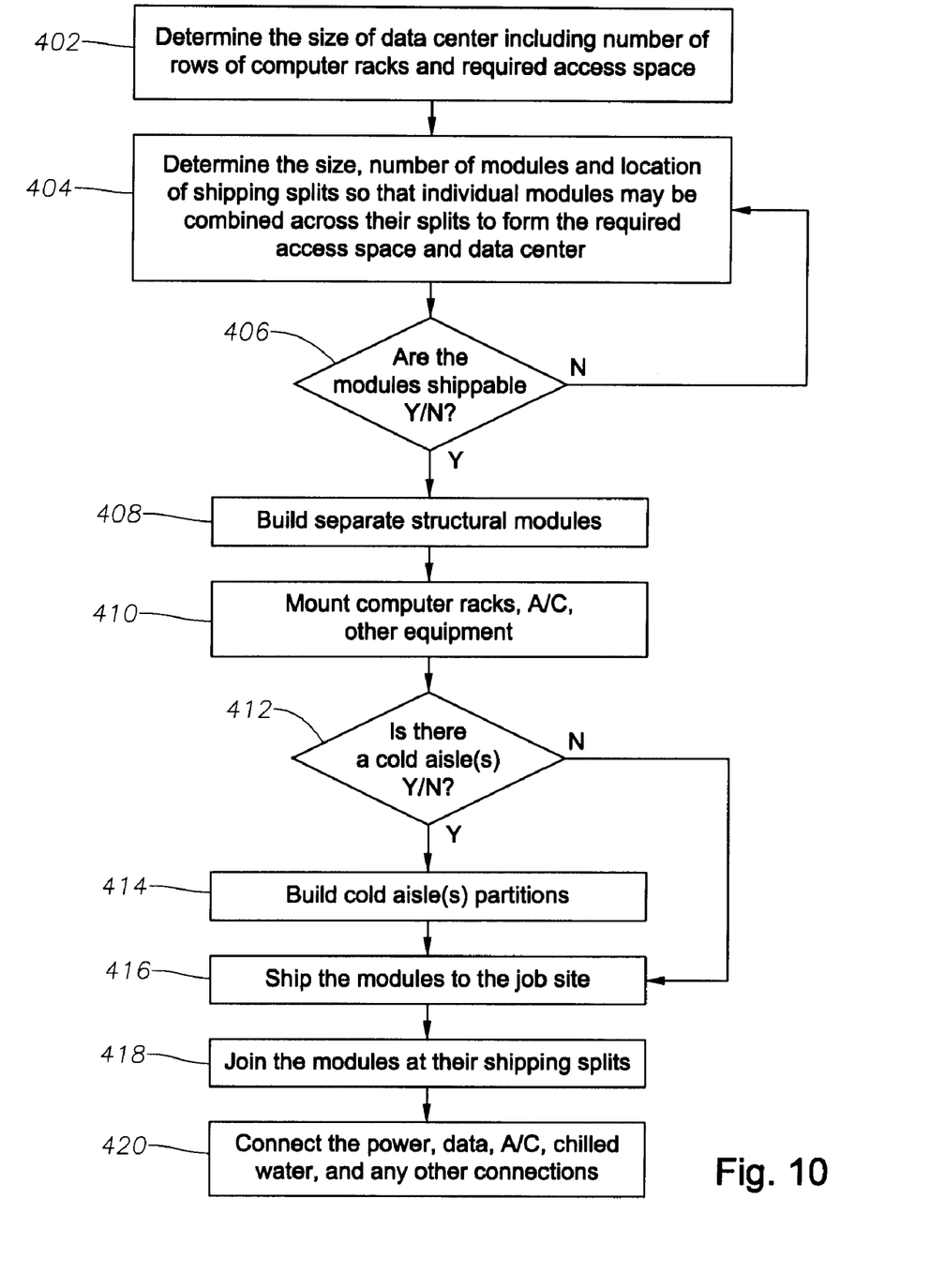
FIG. 10 illustrates a method for forming a modular data center.

FIG. 10 is a flow-chart diagram of at least a portion of a method 400 of forming a modular data center 200 or modular data center 300 as shown in FIGS. 1-9 according to one or more aspects of the present disclosure. Referring to FIG. 10, the method 400 includes a step 402 in which it is determined the size of the data center. Step 402 may require determining how many rows of computer rack units may be required and how much access space is required on either side of the unit. For example, it may be determined that two rows of computer rack units are required, with each row 40 feet long, and that three feet of access space is required to the rear of each computer rack unit and four feet of access space between the two rows of computer rack units. In this example, with each computer rack unit being approximately three feet wide, then the width of the data center must be at least sixteen feet wide and long enough to accommodate the 40 feet long computer rack units plus any auxiliary equipment. In subsequent step 404, it is determined the size of the modules, the number of modules and the location of shipping splits between the modules that are required to form the data center that was determined in step 402. For example, using the preceding example, if it is determined in step 402 that a data center 50 feet long by 17 feet wide will accommodate the two rows of 40 feet long computer racks, plus air conditioning and other equipment previously discussed, then in step 404 it may be determined that two modules, each 50 feet long by 8 feet-6 inches wide will meet the project requirements. In this step 404, the four feet of access space that was necessary between the two rows of computer rack units is obtained by the joining of the two modules along their shipping split, where each module provides a portion of the total required four feet of access space. Thus, as described previously, by the combination of modules along their length dimension the required access space is obtained when each module's access space is joined. By way of another example, if it is determined in step 402 that a data center 50 feet long by 50 feet wide will accommodate the necessary computer racks, and will also include additional chillers and pumps and electrical generators, then in step 404 it may be determined that five modules, each approximately 50 feet long by 10 feet wide will meet the project requirements, or in step 404 it may be determined that due to equipment spacing reasons or other reasons, it is more appropriate that six modules, each approximately 8 feet by 3 inches wide and 50 feet long will meet the project requirements.

In subsequent step 406, it must be decided whether the size of the modules determined in step 404 are shippable, if not, then step 404 must be performed, if the modules are shippable, then step 408 is performed in which the separate structural modules are formed. After the separate structural modules are formed in 408, the various computer racks, air conditioning, and other equipment are mounted within the separate structural modules in step 410. In step 412, if a cold aisle or cold aisles are to be formed within the modular data center, then the cold aisle partitions and enclosures must be installed. If there are no cold aisle partitions or enclosures to be installed, or after the installation of the cold aisle partitions in step 414, the separate modules are ready to be shipped to the job-site in step 416. Once the modules are received at the job site, they may be joined at their shipping splits to form the modular data center in step 418. After the modules are joined, then the various power, data, chilled water, and any other connections may be joined between the modules and between the modular data center and any field provided power, chilled water, data, condenser water and any other field provided connections in step 420.

While various possible embodiments of air handling systems have been described, those of ordinary skill in the art will appreciate that the invention is not limited to any particular type of such system. Likewise, while it may be desirable in some instances to separately control the environment inside and outside a particular area, it is not necessary for the invention. In one embodiment, however, it is contemplated that a method for cooling computer rack units in a modular data center includes the steps of utilizing computer rack units to form an enclosed area or "cold aisle" and adjusting air temperatures and/or pressures within the enclosed area to force air flow through the computer rack units from the interior of the enclosed area to the exterior of the enclosed area. As air passes through the computer rack units, heat is removed. The heated air outside the enclosed area (although inside the modular data center 200), can then be passed through heat exchangers, over cooling coils or otherwise conditioned to remove the heat so that the air can be recirculated back into the enclosed area.

Therefore, the present invention is well adapted to attain the ends and advantages mentioned as well as those that are inherent therein. The particular embodiments disclosed above are illustrative only, as the present invention may be modified and practiced in different but equivalent manners apparent to those of ordinary skill in the art having the benefit of the teachings herein. For example, the embodiments discussed above describe the combination of two modules to allow for the combination of their access space to computer rack units. In alternative embodiments, three or more modules could be combined as described above. In addition, not only can the modules be combined along their length dimension to make for a wider combined module, but modules can be combined along their width dimension to make for a longer combined module. Moreover, it is within the scope of the present invention to stack modules one on top of the other. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. Also, the terms in the claims have their plain, ordinary meaning unless otherwise explicitly and clearly defined by the patentee.

What is claimed is:

1. A modular data center, comprising:
   a first module having a first side with a wall disposed along the first side, a second side opposite the first side with an opening formed in the second side, a first access area adjacent the opening between the opening and the first side of the first module and a first computer rack disposed between the first side and the first access area; and
   a second module having a first side with a wall disposed along the first side, a second side opposite the first side with an opening formed in the second side, a second access area adjacent the opening between the opening and the first side of the second module and a second computer rack disposed between the first side and the second access area;
   wherein the first module is joined with the second module so that the first and second access areas are combined and extend between the first and second computer racks.

2. The modular data center of claim 1, further comprising an enclosure around the first and second access areas whereby the combined access areas are enclosed.

3. The modular data center of claim 2, further comprising a cooling system, wherein the cooling system is segregated to separately cool the enclosed access area from the rest of the modular data center.

4. The modular data center of claim 1, wherein the first module and the second module are bolted together.

5. The modular data center of claim 1, wherein the first module and the second module each further comprise a structural base rail, a floor mounted on top of the structural base rail and a chase formed beneath the floor.

6. The modular data center of claim 1, further comprising a platform on which each computer rack is mounted, each platform having a base with at least two apertures disposed therein.

7. The modular data center of claim 1, wherein the first and second modules are approximately 8 feet wide.

8. The modular data center of claim 1, wherein the first and second modules are no more than 8 feet wide.

9. The modular data center of claim 1, further comprising one or more cooling coils mounted on the first or second computer racks.

10. A method of forming a modular data center, comprising:
    providing a first structural module having a first computer rack mounted therein and a first access area defined adjacent the first computer rack;
    providing a second structural module having a second computer rack mounted therein and a second access area defined adjacent the second computer rack; and
    securing the first structural module and the second structural module to one another so that the first and second access areas are combined and extend between the first and second computer racks.

11. The method of forming a modular data center of claim 10, further comprising forming an enclosure around the first and second access areas to form an enclosed access area.

12. The method of forming a modular data center of claim 11, further comprising separately cooling the enclosed access area from the rest of the modular data center.

13. The method of forming a modular data center of claim 10, wherein the first module and the second module are bolted together.

14. The method of forming a modular data center of claim 13, further comprising forming a co-extensive chase beneath the floor of the secured first and second modules.

15. The method of forming a modular data center of claim 14, further comprising installing a plurality of computer racks in each module prior to securing the modules to one another, wherein the plurality of computer racks are mounted on a platform which platform is disposed to be moved and installed as one integral unit.

16. The method of claim 10, wherein the modules are no more than eight feet wide.

17. A modular data center, comprising:
a first module having opposing end walls with a first exterior side wall disposed therebetween, a ceiling, a floor and an opening defined in a side opposite the first exterior side wall, the opening being spaced apart from the first exterior side wall no more than approximately 8 feet, a first elongated computer rack spaced apart from the first exterior side wall and extending along a substantial portion of the length of the first exterior side wall from a computer rack first end to a computer rack second end, the first computer rack having an exterior side facing the first exterior wall and an interior side facing the opening, wherein a first access area extends between the first computer rack and the first module side; and
a second module having opposing end walls with a second exterior side wall disposed therebetween, a ceiling, a floor and an opening defined in a side opposite the second exterior side wall, the opening being spaced apart from the second exterior side wall no more than approximately 8 feet, a second elongated computer rack spaced apart from the second exterior side wall and extending along a substantial portion of the length of the second exterior side wall, from a computer rack first end to a computer rack second end, the second computer rack having an exterior side facing the second exterior wall and an interior side facing the opening, wherein a second access area extends between the second computer rack and the second module side;
wherein the first module is joined with the second module so that the first and second computer racks are parallel to one another and the access areas of the modules form a contiguous space between the parallel computer racks.

18. The modular data center of claim 17, further comprising an enclosure around the first and second access areas forming the contiguous space.

19. The modular data center of claim 18, wherein the enclosure further comprises a first enclosure wall extending between the first computer rack and the ceiling of the first module, a second enclosure wall extending between the second computer rack and the ceiling of the second module, a first end enclosure wall extending between the respective first ends of the first and second computer racks and a second end enclosure wall extending between the respective second ends of the first and second computer racks, wherein the interior sides of the first and second computer racks are disposed within the enclosure and the exterior sides of the first and second computer racks are disposed outside of the enclosure.

20. The modular data center of claim 19, further comprising a cooling system, wherein the cooling system is disposed to maintain the environment inside the enclosure at a first temperature and the environment outside the enclosure at a second temperature.

21. The modular data center of claim 20, wherein the cooling system is disposed to create air flow from the environment inside the enclosure to the environment outside the enclosure through the first and second computer racks.

22. A modular data center comprising:
first and second building modules;
wherein a computer rack is disposed in each of the first and second building modules and spaced apart from an exterior wall thereof to define an exterior access space and spaced apart from an interior opening thereof to define an interior access space,
wherein the first and second building modules are joined so that the interior openings thereof abut one another and the interior access space of the first and second modules form a contiguous space between the computer racks, which space satisfies access requirements for each computer rack.

23. The modular data center of claim 22, further comprising an enclosure around the interior access space of the computer racks.

24. The modular data center of claim 22, wherein the exterior access space of the first and second building modules is larger than the interior access space of the first and second building modules.

25. The modular data center of claim 24, wherein the exterior access space of the first and second building modules is approximately 3 feet.

26. A method for constructing a modular data center, comprising:
providing first and second building modules, each having a computer rack and having a partial computer rack access space defined within the module, and
joining the first and second building modules to one another so that the respective partial access spaces are contiguous, wherein a portion of the access space of the first building module forms part of the access space of the second module.

27. The method of claim 26, wherein the access space associated with a computer rack comprises the actual access space and the desired access space, wherein the actual access space is the distance between a computer rack and a module side and wherein the desired access space is the access space desired for a computer rack, wherein the actual access space for a module is less than the desired access space for a module, wherein a portion of the actual access space of the first building module is combined with the actual access space of the second building module so as to satisfy the desired access space of the second module.

28. The method of claim 27, wherein a portion of the actual access space of the second module is combined with the actual access space of the first module so as to satisfy the desired access space of the first module.

29. A method for constructing a modular data center, comprising:
providing first and second building modules, each building module containing a computer rack;
joining the first and second building modules so that the computer racks are spaced apart from one another to form an access space therebetween;
enclosing the access space between the computer racks so as to create a first temperature zone inside the enclosure and a second temperature zone outside the enclosure but within the modular data center;
directing air flow into the enclosed access space and causing the air to flow from the first temperature zone to the second temperature zone, thereby cooling the computer rack.

30. The method of claim 29, wherein the computer racks form part of the enclosure and wherein air is directed though the computer racks in order to flow from the first temperature zone to the second temperature zone.

31. The method of claim 29, wherein the first temperature zone is cooler than the second temperature zone.

32. A modular data center, comprising:
a first module having a first side with a wall disposed along the first side, a second side opposite the first side with an opening formed in the second side, the first module further containing a first access area defined adjacent the opening between the opening and the first side of the first module and a first computer rack disposed between the first side and the first access area;

a second module having a first side with a wall disposed along the first side, a second side opposite the first side with an opening formed in the second side, the second module further containing a second access area defined adjacent the opening between the opening and the first side of the second module and a second computer rack disposed between the first side and the second access area;

a third module having opposing sides, each with an opening formed in the opposing sides, the third module further containing a third computer rack disposed between the opposing sides with an intermediate access area defined on either side of the third computer rack between the third computer rack and the respective opening;

wherein the first module is joined with the third module so that the first access area is combined with one intermediate access area between the first and third computer racks; and wherein the second module is joined with the third module so that the second access area is combined with one intermediate access area between the second and third computer racks.

33. The modular data center of claim 32, further comprising an enclosure around the combined first and intermediate access areas whereby the combined access areas are enclosed.

34. A modular data center comprising:

first and second building modules;

wherein data center equipment is disposed in each of the first and second building modules and spaced apart from an exterior wall thereof to define an exterior access space and spaced apart from an interior opening a second predetermined distance to define an interior access space, and wherein the first and second building modules are joined so that the interior openings thereof abut one another and the interior access space of the first and second modules form a contiguous space between the data center equipment, which space satisfies access requirements for the data center equipment.

* * * * *